United States Patent
Namkung et al.

(10) Patent No.: US 11,450,825 B2
(45) Date of Patent: Sep. 20, 2022

(54) FLEXIBLE DISPLAY PANEL AND MANUFACTURING METHOD THEREOF

(71) Applicant: Samsung Display Co., Ltd., Yongin-si (KR)

(72) Inventors: Jun Namkung, Asan-si (KR); Soon Ryong Park, Sejong-si (KR); Chul Woo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 17/099,670

(22) Filed: Nov. 16, 2020

(65) Prior Publication Data

US 2021/0074937 A1    Mar. 11, 2021

Related U.S. Application Data

(63) Continuation of application No. 16/661,823, filed on Oct. 23, 2019, now Pat. No. 10,847,734, which is a
(Continued)

(30) Foreign Application Priority Data

Oct. 14, 2013    (KR) .................. 10-2013-0122078

(51) Int. Cl.
    *H01L 29/08*      (2006.01)
    *H01L 51/00*      (2006.01)
    (Continued)

(52) U.S. Cl.
    CPC ...... *H01L 51/0097* (2013.01); *H01L 27/3244* (2013.01); *H01L 51/003* (2013.01);
    (Continued)

(58) Field of Classification Search
    CPC ........... H01L 21/67369; H01L 23/4985; H01L 23/5387; H01L 27/3244; H01L 2251/5338; H01L 51/003; H01L 51/56; H01L 51/0097
    (Continued)

(56) References Cited

U.S. PATENT DOCUMENTS 7,176,568 B2    2/2007    Urushido
9,882,152 B2    1/2018    Namkung et al.
(Continued)

FOREIGN PATENT DOCUMENTS

JP    WO-2012161152    * 11/2012
KR    10-0700644         3/2007
(Continued)

*Primary Examiner* — Tan N Tran
(74) *Attorney, Agent, or Firm* — Lewis Roca Rothgerber Christie LLP

(57) ABSTRACT

A flexible display panel and a manufacturing method which is capable of removing a non-display area without damaging a display element layer, the flexible display panel includes a flexible substrate which includes a display area and a peripheral area outside of the display area, a display element layer disposed on the flexible substrate, and a neutral plane balancing layer disposed on the display element layer in the peripheral area, wherein the peripheral area of the flexible substrate in which the neutral plane balancing layer is disposed is folded towards a rear side of the display area along a first bending line, and the neutral plane balancing layer overlaps the first bending line.

15 Claims, 15 Drawing Sheets

Related U.S. Application Data continuation of application No. 15/871,072, filed on Jan. 15, 2018, now Pat. No. 10,461,267, which is a continuation of application No. 14/256,581, filed on Apr. 18, 2014, now Pat. No. 9,882,152.

(51) Int. Cl.
*H01L 51/52* (2006.01)
*H01L 27/32* (2006.01)

(52) U.S. Cl.
CPC .. *H01L 51/5281* (2013.01); *H01L 2251/5338* (2013.01); *H01L 2251/566* (2013.01); *Y02E 10/549* (2013.01); *Y02P 70/50* (2015.11)

(58) Field of Classification Search
USPC .............................................. 257/40, 59, 72
See application file for complete search history.

(56) References Cited

U.S. PATENT DOCUMENTS

| | | |
|---|---|---|
| 10,461,267 B2 | 10/2019 | Namkung et al. |
| 2005/0110049 A1 | 5/2005 | Urushido |
| 2009/0021666 A1 | 1/2009 | Chen |
| 2012/0146886 A1 | 6/2012 | Minami et al. |
| 2013/0169515 A1 | 7/2013 | Prushinskiy et al. |
| 2014/0048314 A1 | 2/2014 | Kido et al. |

FOREIGN PATENT DOCUMENTS

| | | |
|---|---|---|
| KR | 10-0747275 | 8/2007 |
| KR | 10-2011-0068169 | 6/2011 |
| KR | 10-2013-0007311 | 1/2013 |
| KR | 10-2013-0032111 | 4/2013 |
| KR | 10-2013-0076402 | 7/2013 |

\* cited by examiner

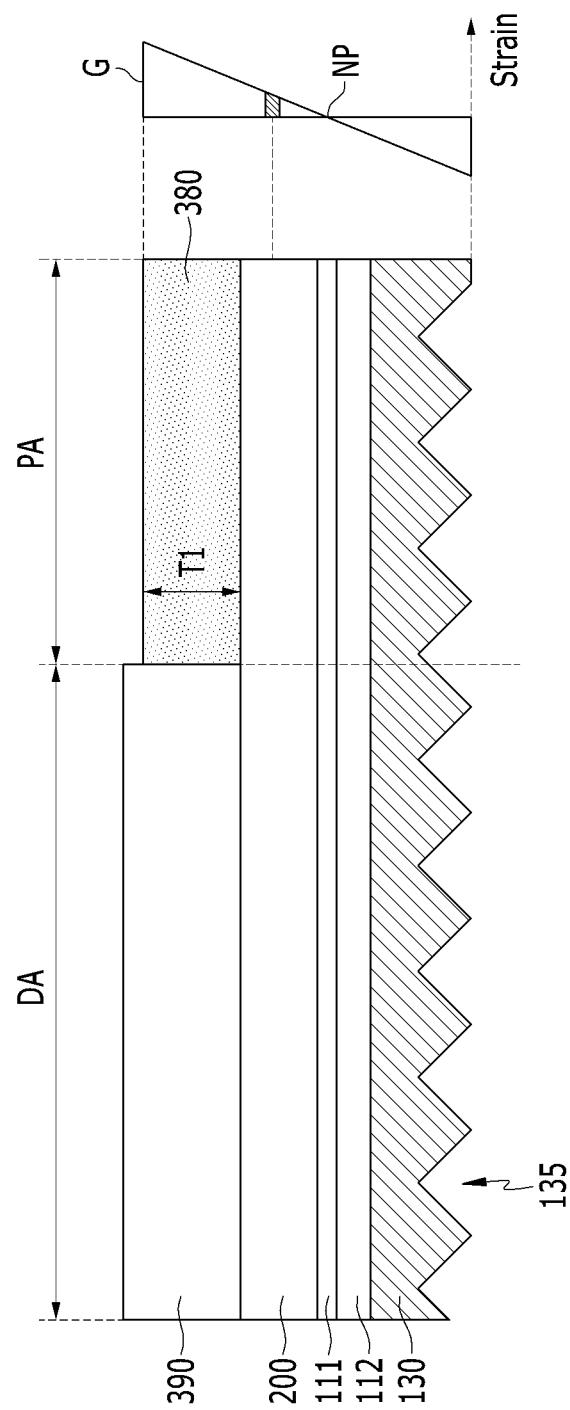

FLEXIBLE DISPLAY PANEL AND MANUFACTURING METHOD THEREOF

CROSS-REFERENCE TO RELATED APPLICATIONS

This application is a continuation of U.S. patent application Ser. No. 16/661,823, filed Oct. 23, 2019, which is a continuation of U.S. patent application Ser. No. 15/871,072, filed Jan. 15, 2018, now U.S. Pat. No. 10,461,267, which is a continuation of U.S. patent application Ser. No. 14/256,581, filed Apr. 18, 2014, now U.S. Pat. No. 9,882,152, which claims priority to and the benefit of Korean Patent Application No. 10-2013-0122078, filed Oct. 14, 2013, the entire content of all of which is incorporated herein by reference.

BACKGROUND

1. Field

The present invention relates to a flexible display panel and a manufacturing method thereof. More particularly, the present invention relates to a flexible display panel and a manufacturing method thereof which are capable of removing a non-display area without damaging a display element layer.

2. Description of the Related Art

A display device such as a liquid crystal display (LCD), an organic light emitting diode (OLED) display, and an electrophoretic display include a field generating electrode and an electro-optical active layer.

For example, the organic light emitting diode (OLED) display includes an organic light emitting layer as the electro-optical active layer.

The field generating electrode is connected to a switching element such as a thin film transistor to receive a data signal, and the electro-optical active layer converts the data signal to an optical signal to display an image.

Among the display devices, since the organic light emitting diode (OLED) display, as a self-light emitting type, does not require an additional light source, it is advantageous in terms of power consumption, response speed and, viewing angle, and contrast ratio are excellent.

The organic light emitting diode (OLED) display includes a plurality of pixels such as red pixels, blue pixels, green pixels, and white pixels, and may express full colors by combining the pixels.

Each pixel includes an organic light emitting element, and a plurality of thin film transistors for driving the organic light emitting element.

The light emitting element of the organic light emitting diode (OLED) display includes a pixel electrode, a common electrode, and a light emitting layer interposed between the two electrodes.

One of the pixel electrode and the common electrode becomes an anode, and the other becomes a cathode.

An electron injected from the cathode and a hole injected from the anode are coupled with each other in the light emitting layer to form an exciton, and the exciton emits light while discharging energy.

The common electrode is formed throughout a plurality of pixels, and transfers a predetermined common voltage.

In the case of the organic light emitting diode (OLED) display, to reduce reflection of external light, a polarizing plate may be attached to an upper part of a display panel, a touch panel may be attached to the upper part of the display panel to sense external contact, or a lower passivation film may be attached to a bottom side of the display panel.

In cases where the display panel of the display device uses a glass substrate which is heavy and easily damaged, there is a limitation in its portability and implementation of a large-scale screen display.

Thus, recently, a display device which is light, strong against impact, and uses a flexible plastic substrate has been developed.

Meanwhile, the display panel of the display device includes a display area where a plurality of display pixels are disposed, and a peripheral area surrounding the display area.

The peripheral area is provided with various kinds of wires for transmitting a driving signal to a signal line connected to a thin film transistor of the display area, and various kinds of voltage pads for receiving voltages from an external source.

The peripheral area forms a non-display area because it does not display an image, and the display area is reduced as the non-display area increases.

Recently, demand for a display device having a smaller non-display area is increasing.

The above information disclosed in this Background section is only for enhancement of an understanding of the background of the invention and therefore it may contain information that does not form the prior art that is already known to a person of ordinary skill in the art.

SUMMARY

In embodiments of a flexible display device, when a display panel is to be folded in order to remove a non-display area, a large amount of stress is applied to a layer of the display panel where a thin film transistor and a light emitting element are disposed, thereby damaging the display panel.

When the thin film transistor and the light emitting element are damaged, these elements do not properly function or the performance thereof may be deteriorated to cause problems in display quality of an image, and stress due to bending may be accumulated to cause cracks or delamination of the display element layer.

Embodiments of the present invention have been made in an effort to provide a flexible display panel and a manufacturing method thereof which is capable of removing a non-display area without damaging a display element layer which includes a thin film transistor and a light emitting element.

A flexible display panel according to an exemplary embodiment of the present invention includes a flexible substrate including a display area and a peripheral area outside of the display area, a display element layer disposed on the flexible substrate, and a neutral plane balancing layer disposed on the display element layer in the peripheral area, wherein the peripheral area of the flexible substrate in which the neutral plane balancing layer is disposed is folded towards a rear side of the display area along a first bending line, and the neutral plane balancing layer overlaps the first bending line.

A lower passivation film may be disposed under the flexible substrate, and a bottom side of the lower passivation film may include a plurality of grooves.

A thickness of the neutral plane balancing layer may be from about 10 μm to about 150 μm.

The neutral plane balancing layer may include an acryl or silicon-based resin.

The neutral plane balancing layer may further include nanoparticles or micro-particles.

The curvature radius of the flexible substrate folded along the first bending line may be from about 0.5 mm to about 10 mm.

The display element layer may include a plurality of thin film transistors, a plurality of light emitting elements, and an encapsulation layer sealing the light emitting elements.

The peripheral area includes a first peripheral area in which a wiring portion is disposed and a second peripheral area in which a pad area is disposed, and the neutral plane balancing layer may be formed in the second peripheral area.

A flexible display panel according to another exemplary embodiment of the present invention includes a flexible substrate including a display area and a peripheral area outside of the display area, a display element layer disposed on the flexible substrate, and a lower passivation film disposed under the flexible substrate, wherein a bottom side of the lower passivation film includes a plurality of grooves, and the peripheral area of the flexible substrate is folded towards a rear side of the display area along a first bending line.

A neutral plane balancing layer may be disposed on the display element layer of the peripheral area.

The neutral plane balancing layer may overlap the first bending line.

A part of the peripheral area folded towards the rear side of the display area may be folded outwards along a second bending line disposed outside of the first bending line.

A flexible display panel according to another exemplary embodiment of the present invention includes a flexible substrate which includes a display area and a peripheral area outside of the display area, and a display element layer disposed on the flexible substrate, wherein a peripheral area of the flexible substrate is folded towards a rear side of the display panel along a first bending line, and a part of the peripheral area folded towards the rear side of the display area is folded outwards along a second bending line which is disposed outside of the first bending line.

A lower passivation film may be disposed under the flexible substrate, and a bottom side of the lower passivation film may include a plurality of grooves.

A manufacturing method of a flexible display panel according to an exemplary embodiment of the present invention includes forming a display element layer by laminating a plurality of thin films on a flexible substrate which includes a display area and a peripheral area outside of the display area, forming a neutral plane balancing layer on the display element layer in the peripheral area, and folding the peripheral area of the flexible substrate where the neutral plane balancing layer is disposed towards a rear side of the display panel along a first bending line, and wherein the neutral plane balancing layer overlaps the first bending line.

The method further includes attaching a lower passivation film to a bottom side of the flexible substrate, and a bottom side of the lower passivation film may include a plurality of grooves.

A manufacturing method of a flexible display panel according to another exemplary embodiment of the present invention includes forming a display element layer on a flexible substrate which includes a display area and a peripheral area outside of the display area, attaching a lower passivation film to a bottom side of the flexible substrate, and bending the peripheral area of the flexible substrate towards a rear side of the display area along a first bending line, wherein a bottom side of the lower passivation film includes a plurality of grooves.

The method further includes forming a neutral plane balancing layer on the display element layer in the peripheral area.

The method may further includes folding a part of the peripheral area forward along a second bending line disposed outside of the first bending line before folding the peripheral area of the flexible substrate towards the rear side of the display area along the first bending line.

A manufacturing method of a flexible display panel according to another exemplary embodiment of the present invention includes forming a display element layer on a flexible substrate which includes a display area and a peripheral area outside of the display area, folding a part of the peripheral area forward along a first bending line crossing the peripheral area, and folding the folded peripheral area towards the rear side of the display area along a second bending line disposed inside of the first bending line.

According to an exemplary embodiment of the present invention, a non-display area may be removed without damaging a display element layer which includes a thin film transistor and a light emitting element.

BRIEF DESCRIPTION OF THE DRAWINGS

FIG. 5A and FIG. 5B are cross-sectional views of the display panel of FIG. 4A taken along the line V-V.

DETAILED DESCRIPTION

Figure 1:
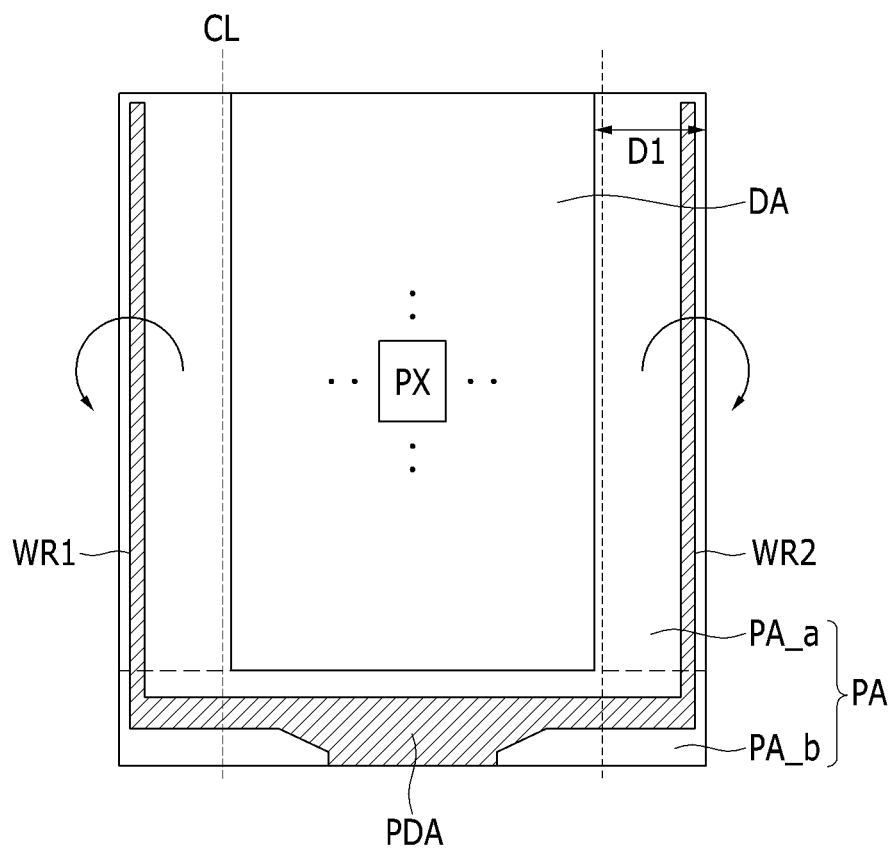
FIG. 1 is a top plan view of a display panel before a peripheral area is folded backwards in a manufacturing process of a flexible display panel according to an exemplary embodiment of the invention.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

Figure 4A:
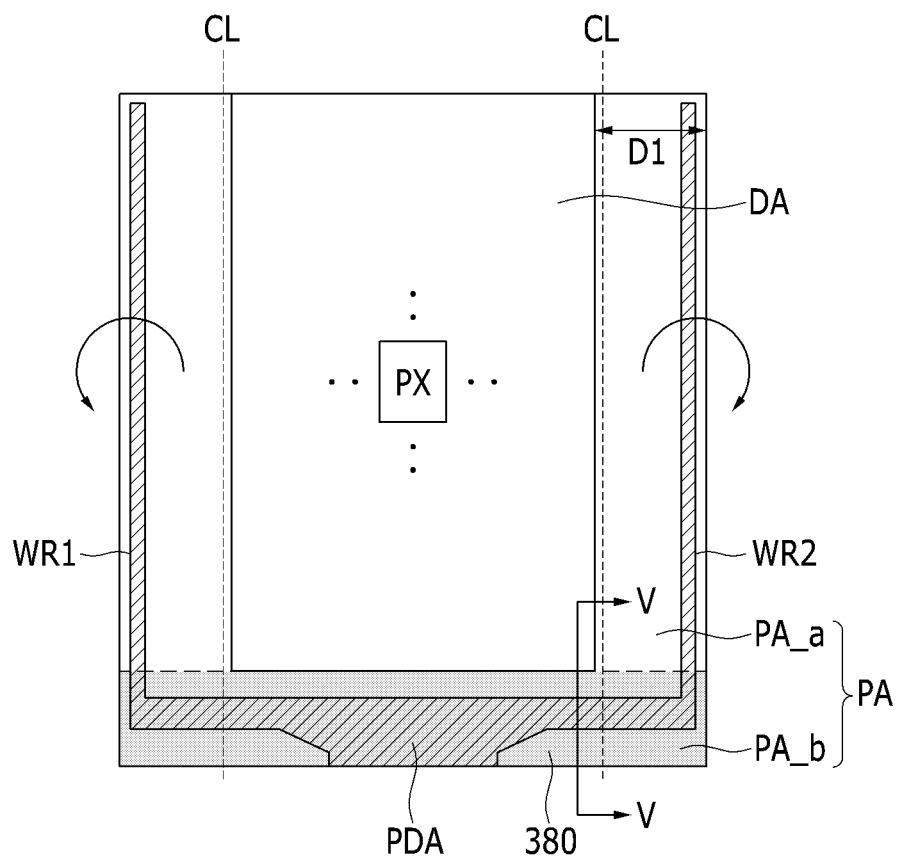
FIG. 4A, FIG. 4B, and FIG. 4C are top plan views of the display panel before the peripheral area is folded backwards in a manufacturing process of a flexible display panel according to an exemplary embodiment of the present invention.
Figure 4B:
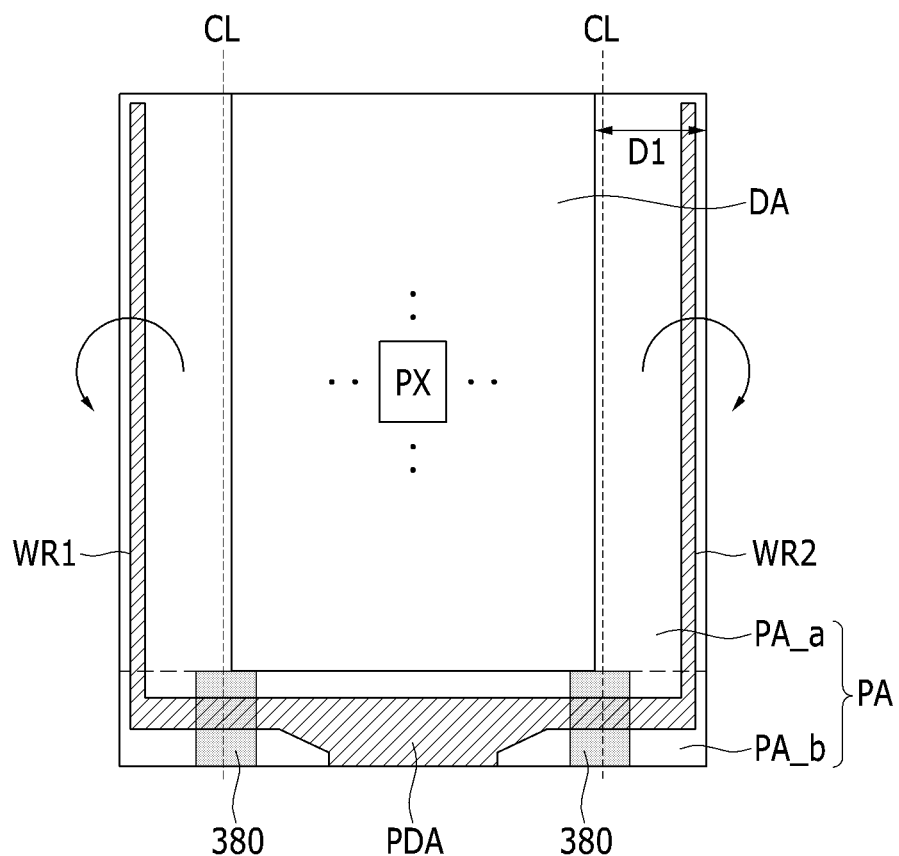
Figure 4C:
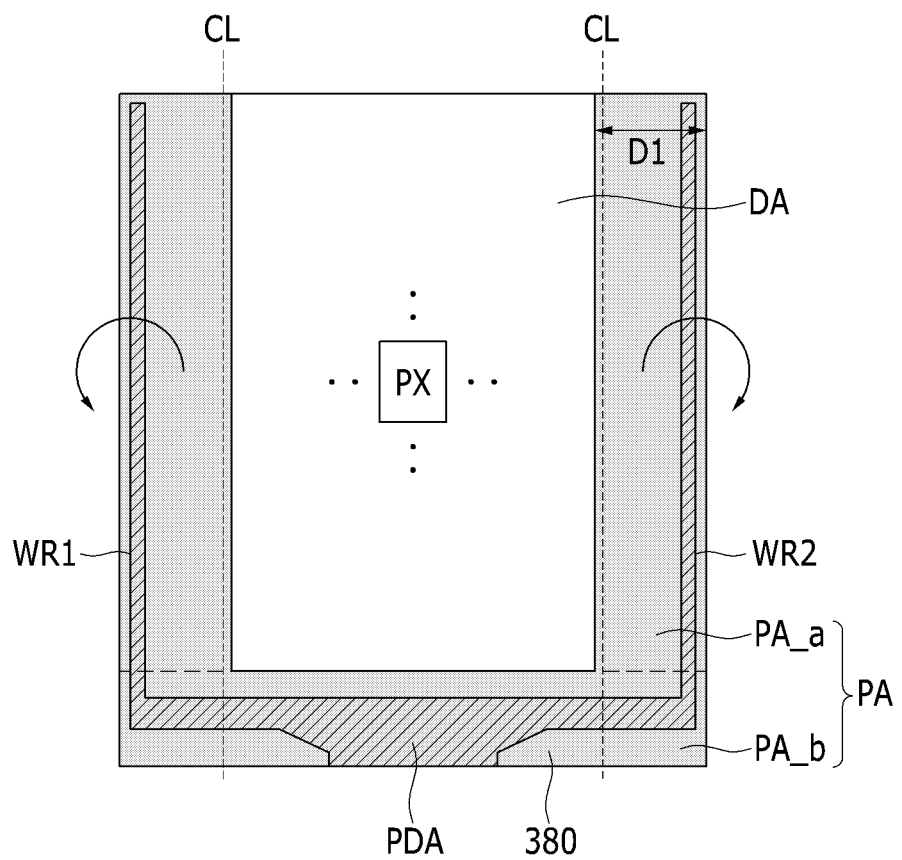
Figure 5B:
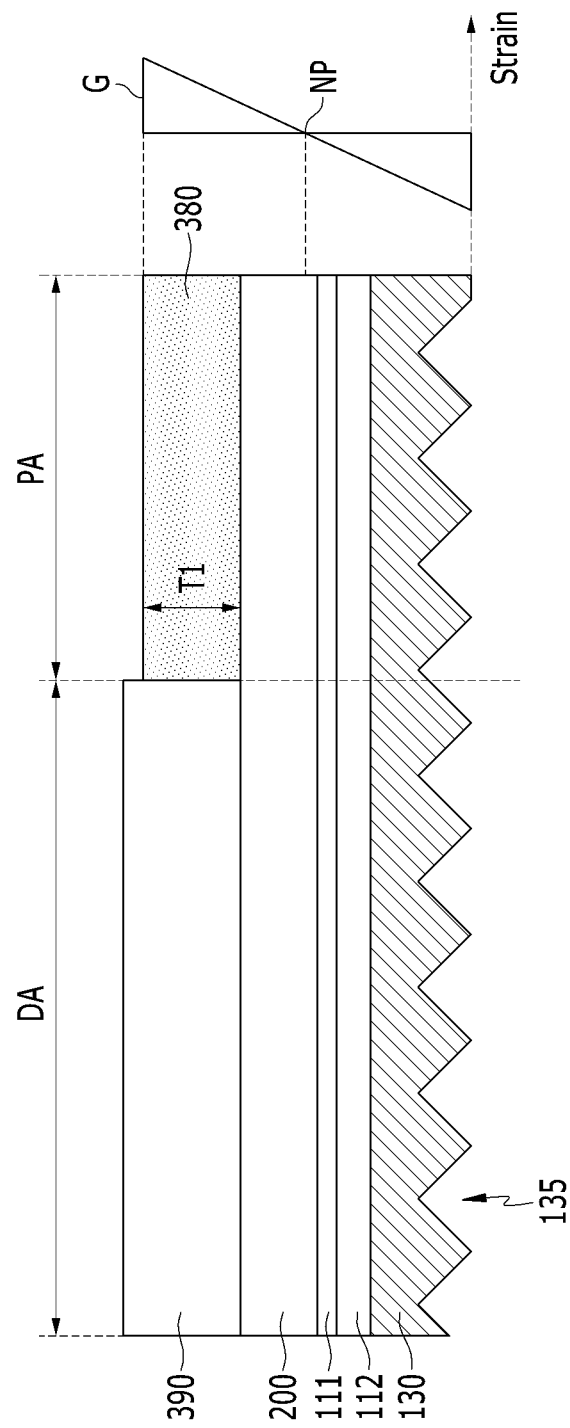
Figure 6:
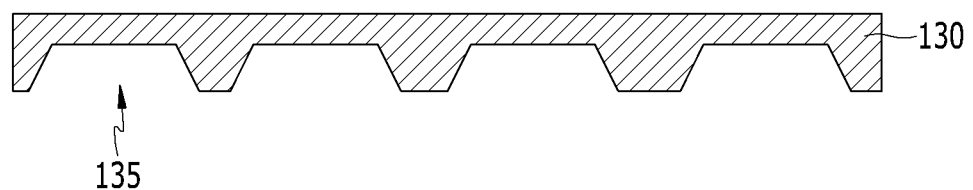
FIG. 6 is a cross-sectional view of a lower passivation film of the display panel according to an exemplary embodiment of the present invention.
Figure 7:
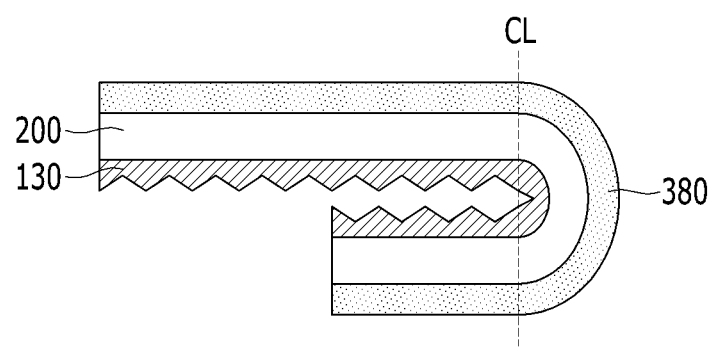
FIG. 7 is a cross-sectional view showing a state in which the peripheral area of the display panel according to an exemplary embodiment of the present invention is folded backwards.
Figure 8:
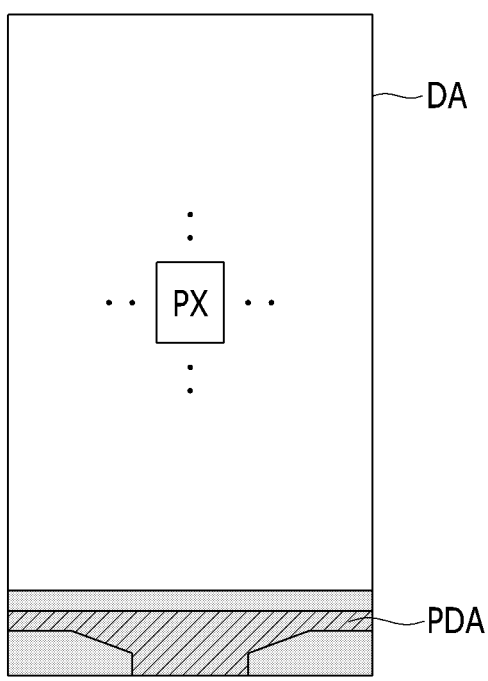
FIG. 8 is a top plan view showing a state in which the peripheral area of the display panel according to an exemplary embodiment of the present invention is folded backwards.

First, Referring to FIG. 1 through FIG. 8, a flexible display panel and its manufacturing method according to an exemplary embodiment of the present invention will be described. FIG. 1 is a top plan view of a display panel before a peripheral area is folded backwards in a manufacturing process of a flexible display panel according to an exemplary embodiment of the invention, FIG. 2 is a layout view showing a pixel of the display panel according to an exemplary embodiment of the present invention, FIG. 3 is a cross-sectional view of the display panel of FIG. 2 taken along the line III-III, FIG. 4A, FIG. 4B, and FIG. 4C are top plan views of the display panel before the peripheral area is folded backwards in a manufacturing process of a flexible display panel according to an exemplary embodiment of the present invention, FIG. 5A and FIG. 5B are cross-sectional views of the display panel of FIG. 4A taken along the line V-V, FIG. 6 is a cross-sectional view of a lower passivation film of the display panel according to an exemplary embodiment of the present invention, FIG. 7 is a cross-sectional view showing a state in which the peripheral area of the display panel according to an exemplary embodiment of the present invention is folded backwards, and FIG. 8 is a top plan view showing a state in which the peripheral area of the display panel according to an exemplary embodiment of the present invention is folded backwards.

Figure 2:
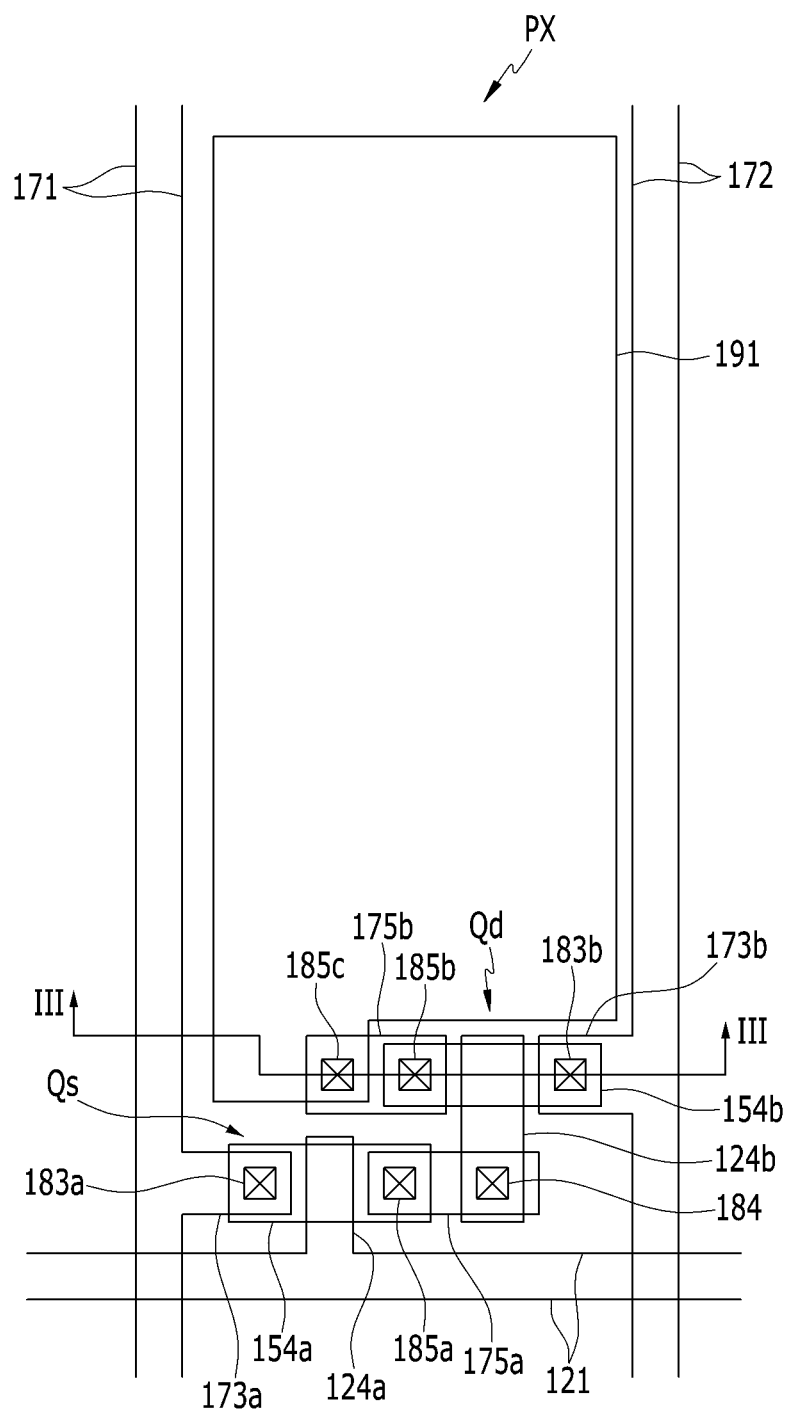
FIG. 2 is a layout view showing a pixel of the display panel according to an exemplary embodiment of the present invention.
Figure 3:
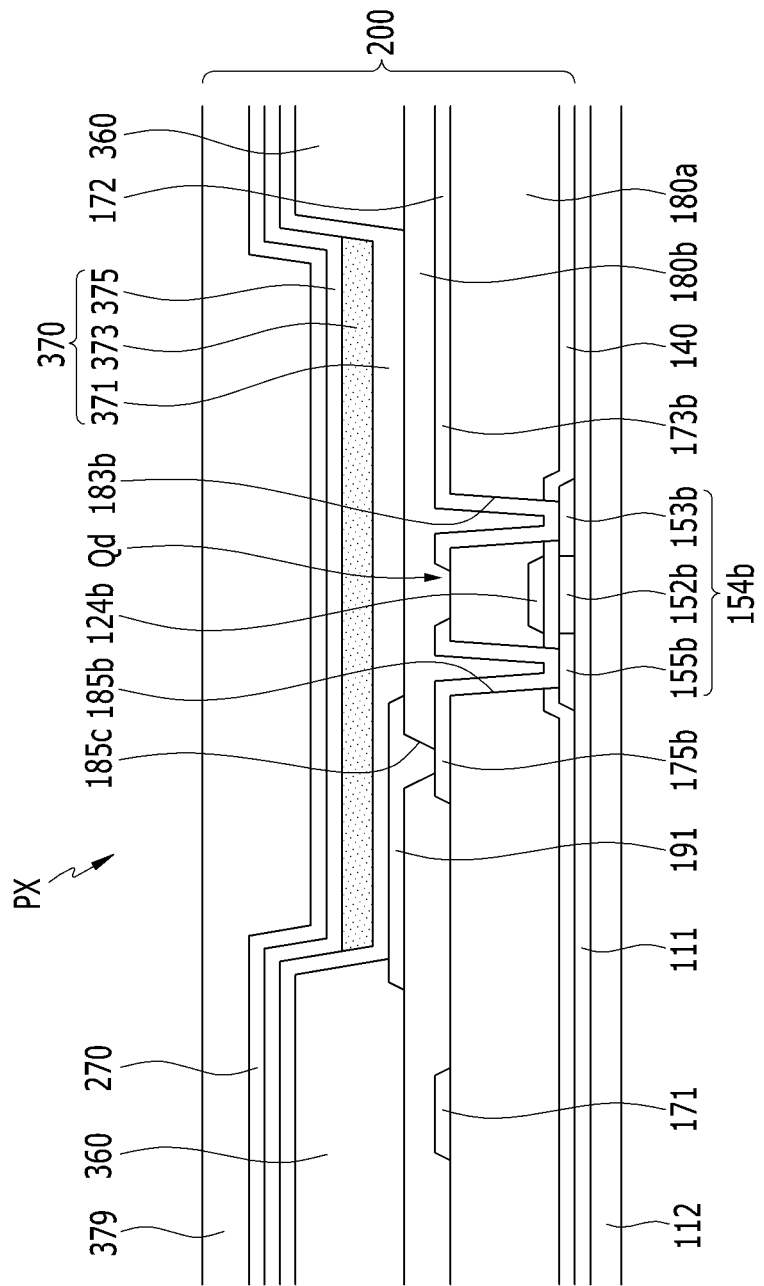
FIG. 3 is a cross-sectional view of the display panel of FIG. 2 taken along the line III-III.

First, referring to FIG. 1 through FIG. 3, a flexible substrate 112 is formed on a supporting substrate (not shown) made of glass or plastic.

When viewed on a plane, the flexible substrate 112 includes a display area DA for displaying an image and a peripheral area PA outside of the display area.

The supporting substrate may be various kinds of substrates which are capable of supporting the flexible substrate 112 and endure manufacturing stresses.

The supporting substrate will be removed on completion of the flexible display panel.

The flexible substrate 112 may include a flexible plastic.

For example, the flexible substrate 112 may include polyethylene terephthalate (PET), polyethylene naphthalate, polycarbonate, polyarylate, polyetherimide, polyether sulfone, polyimide, and the like.

Next, a barrier layer 111 may be formed on the flexible substrate 112.

The barrier layer 111 may prevent external impurities from penetrating through the flexible substrate 112 and then permeating into a display element layer disposed thereon, and a surface of the barrier layer 111 may be smooth.

The barrier layer 111 may include at least one of an organic or inorganic film. For example, the barrier layer 111 may include a silicon nitride ($SiN_x$), a silicon oxide ($SiO_x$), or a silicon oxynitride ($SiO_xN_y$).

The barrier layer 111 may be omitted.

Next, a display element layer 200 including a plurality of thin films is formed on the barrier layer 111.

The display element layer 200 includes a plurality of signal lines which are disposed at the display area, and a plurality of pixels PX which are connected to the signal lines and are arranged in an approximate matrix form.

The signal lines may include a plurality of scanning signal lines to transmit a scanning signal, and a plurality of data lines to transmit a data signal.

The display element layer 200 may include wiring portions WR1 and WR2 which are disposed at the peripheral area PA, and a pad area PDA which is connected to a driving portion (not illustrated) to drive pixels PX.

Accordingly, the peripheral area PA includes a first peripheral area PA_a in which the wiring portions WR1 and WR2 are disposed, and a second peripheral area PA_b in which the pad area PDA is disposed.

The pad area PDA and wiring portions WR1 and WR2 may be connected to each other, and may be made of a conductive material.

The wiring portions WR1 and WR2 may be connected to a plurality of signal lines in the display area DA, and may be disposed at respective lateral sides of the display area DA.

The driving portion may include a scan driver (not illustrated) to transmit scanning signals or a data driver (not illustrated) to transmit data signals.

The driving portion may be directly mounted on the pad area PDA above the flexible substrate 112 in an IC chip form, or may be mounted on a flexible printed circuit film (not illustrated) or on a circuit board, and may be connected to the pad area PDA on the flexible substrate 112 in a tape carrier package TCP form.

Now, referring to FIG. 2 and FIG. 3, a structural example of a display element layer 200 of the flexible display panel will be described.

A plurality of first and second semiconductors 154a and 154b are formed on the barrier layer 111.

The first semiconductor 154a may include a channel region (not illustrated), a source region (not illustrated), and a drain region (not illustrated) which are disposed at respective lateral sides of the channel region and are formed to be doped.

The second semiconductor 154b may include a channel region 152b, a source region 153b and a drain region 155b which are disposed at respective lateral sides of the channel region 152b and are formed to be doped.

The first and second semiconductors 154a and 154b may include amorphous silicon, polysilicon, or an oxide semiconductor.

A gate insulation layer 140 made of a silicon nitride ($SiN_x$) or a silicon oxide ($SiO_x$) is disposed on the first and second semiconductors 154a and 154b.

A plurality of scanning signal lines 121 including a first control electrode 124a and a plurality of gate conductors including a second control electrode 124b are formed on the gate insulation layer 140.

The scanning signal lines 121 transfer scanning signals, and may extend mainly in a horizontal direction.

The first control electrode 124a may extend upwards from the scanning signal lines 121.

The second control electrode 124b is separated from the scanning signal lines 121.

Though not illustrated, the second control electrode 124b may include a storage electrode extending in a vertical direction.

The first control electrode 124a may overlap a part of the first semiconductor 154a, particularly the channel region, and the second control electrode 124b may overlap a part of the second semiconductor 154b, particularly the channel region 152b.

A first passivation layer 180a is disposed on the gate insulation layer 140 and the gate conductor.

The first passivation layer 180a and the gate insulation layer 140 include a contact hole 183a which exposes the source region of the first semiconductor 154a, a contact hole 185a which exposes the drain region, a contact hole 183b which exposes the source region 153b of the second semiconductor 154b, and a contact hole 185b which exposes the drain region 155b.

The first passivation layer 180a includes a contact hole 184 which exposes the second control electrode 124b.

A plurality of data conductors including a plurality of data lines 171, a plurality of driving voltage lines 172, and a plurality of data conductors which include a plurality of first output electrodes 175a and a plurality of second output electrodes 175b are formed on the first passivation layer 180a.

The data lines 171 transmit data signals, and may mainly extend in a vertical direction to cross the scanning signal lines 121.

Each data line 171 includes a plurality of first input electrodes 173a which extend toward the first control electrode 124a.

The driving voltage lines 172 transfer a driving voltage, and may mainly extend in a vertical direction to cross the scanning signal lines 121.

Each driving voltage line 172 includes a plurality of second input electrodes 173b which extend toward the second control electrode 124b.

In case the second control electrode 124b includes the storage electrode, the driving voltage lines 172 may include a part which overlaps the storage electrode.

The first and second output electrodes 175a and 175b are separated from each other to have an island shape, and are separated from the data lines 171 and the driving voltage lines 172.

The first input electrode 173a and the first output electrode 175a face each other on the first semiconductor 154a, and the second input electrode 173b and the second output electrode 175b equally face each other on the second semiconductor 154b.

The first input electrode 173a and the first output electrode 175a may be respectively connected to the source region and the drain region of the first semiconductor 154a through the contact holes 183a and 185a. The first output electrode 175a may be connected to the second control electrode 124b through the contact hole 184.

The second input electrode 173b and the second output electrode 175b may be respectively connected to the source region 153b and the drain region 155b of the second semiconductor 154b through the contact holes 183b and 185b.

The first control electrode 124a, the first input electrode 173a, and the first output electrode 175a form a switching thin film transistor Qs together with the first semiconductor 154a, and the second control electrode 124b, the second input electrode 173b, and the second output electrode 175b form a driving thin film transistor Qd together with the second semiconductor 154b.

However, the structure of the switching transistor Qs and the driving transistor Qd is not limited thereto, and may be variously modified.

A second passivation layer 180b made of an inorganic insulator such as a silicon nitride or a silicon oxide may be disposed on the data conductor.

The second passivation layer 180b may have a smooth surface by removing steps in order to improve light emission efficiency of the organic light emitting element to be formed thereon.

The second passivation layer 180b may include a contact hole 185c which exposes the second output electrode 175b.

A plurality of pixel electrodes 191 are formed on the second passivation layer 180b.

The pixel electrode 191 of each pixel PX is physically and electrically connected to the second output electrode 175b through the contact hole 185c of the second passivation layer 180b.

The pixel electrode 191 may include a semi-transmissive conductive material or a reflective conductive material A pixel definition layer 360 (also referred to as a partition) having a plurality of openings exposing the pixel electrode 191 may be disposed on the second passivation layer 180b.

The openings of the pixel definition layer 360 exposing the pixel electrode 191 may define each pixel area.

The pixel definition layer 360 may be omitted.

A light emitting member 370 is positioned on the pixel definition layer 360 and the pixel electrode 191.

The light emitting member 370 may include a first organic common layer 371, a plurality of light emitting layers 373, and a second organic common layer 375 which are laminated in sequence.

The first organic common layer 371 may include, for example, at least one of a hole injecting layer and a hole transport layer which are laminated in sequence.

The first organic common layer 371 may be formed all over the display area in which the pixel PX is disposed, or may be formed only in each pixel PX area.

The light emitting layer 373 may be disposed on the pixel electrode 191 of each corresponding pixel PX.

The light emitting layer 373 may be made of an organic material which uniquely emits light of the primary colors such as red, green, and blue, and may have a structure in which a plurality of organic material layers emitting light of different colors are laminated.

The second organic common layer 375 may include, for example, at least one of an electron transport layer and an electron injecting layer which are laminated in sequence.

The second organic common layer 375 may be formed all over the display area in which the pixel PX is disposed, or may be formed only in each pixel PX area.

The first and second organic common layers 371 and 375 are provided to improve light emitting efficiency of the light emitting layer 373, and one of the first and second organic common layers 371 and 375 may be omitted.

A common electrode 270 transmitting a common voltage Vss is formed on the light emitting member 370.

The common electrode 270 may include a transparent conductive material.

For example, the common electrode 270 is made of a transparent conductive material, or may formed by thinly laminating metals such as calcium (Ca), barium (Ba), magnesium (Mg), aluminum (Al), and silver (Ag) to have a light transmitting property.

The pixel electrode 191, the light emitting member 370, and the common electrode 270 of each pixel PX form a light emitting diode LD, and one of the pixel electrode 191 and the common electrode 270 becomes a cathode and the other becomes an anode.

Further, the storage electrode driving voltage lines 172 overlapped with each other may form a storage capacitor Cst.

The display element layer 200 according to an exemplary embodiment of the present invention may employ a top emission method which displays an image by emitting internal light of the light emitting member 370 towards a frontal direction of the flexible substrate 112.

An encapsulation layer 379 may be further formed on the common electrode 270.

The encapsulation layer 379 may encapsulate the light emitting member 370 and the common electrode 270 to prevent external moisture and oxygen from permeating.

A top surface of the encapsulation layer 379 may be smooth.

The encapsulation layer 379 may include a plurality of thin film layers.

For example, the encapsulation layer 379 may have a multi-layered structure including at least one of an organic film and an inorganic film.

Thus, the display element layer 200 including the thin film transistor, the light emitting diode LD, and the encapsulation layer 379 may be completed.

The wiring portions WR1 and WR2 and the pad area PDA of the peripheral area PA are disposed at the same layer as the gate conductive layer or data conductive layer, and may be integrally formed when the gate conductive layer or data conductive layer is formed.

Referring to FIG. 4A to FIG. 5B, a neutral plane balancing layer 380 is formed in at least a part of the peripheral area PA.

The neutral plane balancing layer 380 is disposed above the display element layer 200.

The neutral plane balancing layer 380 may be formed to at least overlap a bending line CL of the second peripheral area PA_b along which the flexible display panel is later folded.

For example, the neutral plane balancing layer 380 may be formed, as shown in FIG. 4A, all over the second peripheral area PA_b in which the pad area PDA is disposed, or may be formed, as shown in FIG. 4B, to overlap a bending line CL of the second peripheral area PA_b along which the flexible display panel is later folded, or may be formed, as shown in FIG. 4C, not only in the second peripheral area PA_b but also in at least a part of the peripheral area.

The neutral plane balancing layer 380 moves up the position of the neutral plane NP in which strain is virtually zero when the peripheral area PA is folded towards a rear side of the display area DA based on the bending line CL, to dispose the neutral plane NL close to the display element layer 200 or to allow a compressive stress, not a tensile stress, to be applied to the display element layer 200.

Herein, the bending line CL may be a virtual border line between the display area DA and the first peripheral area PA_a, or may be disposed on the periphery of the border line.

The thickness T1 of the neutral plane balancing layer may be from about 10 μm to about 150 μm and an elastic coefficient may be from about 500 MPa to about 100 GPa, but they are not limited thereto, and may be dependent on design specifications of the display panel such as the thickness of the display element layer 200 and the like.

The neutral plane balancing layer 380 may include an acryl or a silicon-based resin, or may include a resin having fine particles.

The fine particles may include rubber including silica, epoxy, polymer-based nanoparticles such as an epoxy hybrid and the like, or micro-particles and the like.

In addition, the neutral plane balancing layer 380 may include various kinds of films including polyethylene terephthalate (PET) and the like.

The horizontal width D1 of the first peripheral area PA_a may be wider than that of the conventional peripheral area.

For example, the horizontal width D1 of the first peripheral area PA_a may be from about two to about six times larger than that of the conventional peripheral area.

For example, the horizontal width D1 of the first peripheral area PA_a may be wider than about 2 mm, but it is not limited thereto, and may be appropriately adjusted.

As such, if the horizontal width of the first peripheral area PA_a is widened, when the first peripheral area PA_a is folded toward a rear side of the display area, bending may be performed only in the first peripheral area PA_a, and the rigidity of the first peripheral area is decreased such that the first peripheral area PA_a can be easily bent.

Referring to FIG. 5A or FIG. 5B, an anti-reflection layer 390, which improves visibility by reducing reflection of external light, may be attached to an upper part of the display element layer 200 of the display area DA.

The anti-reflection layer 390 may be disposed only in the display area DA, or may be disposed to be extended to the first peripheral area PA_a together with the display area DA.

The anti-reflection layer 390 may include a polarizer (not illustrated) or a plurality of thin film layers (not illustrated).

In instances where the anti-reflection layer 390 includes a plurality of thin film layers, the plurality of thin film layers may include at least one thin metal film layer and at least one dielectric layer which are alternately laminated.

Next, the supporting substrate is separated from the flexible substrate 112.

Next, referring to FIG. 5A or 5B, a lower passivation film 130 is attached to a lower part of the flexible substrate 112 after the flexible substrate 112 is separated from the supporting substrate.

The lower passivation film 130 may be disposed at both the display area DA and the peripheral area PA.

Referring to FIG. 5A, FIG. 5B, or FIG. 6, a bottom side of the lower passivation film 130 may have protrusions and depressions including a plurality of grooves 135.

The plurality of grooves 135 may be regularly or irregularly disposed, and the grooves 135 may equally have regular or irregular shapes.

The grooves 135 may respectively have a triangular shape, as shown in FIG. 5A or 5B, or may respectively have a quadrangular shape, as shown in FIG. 6, such as a trapezoidal shape and the like.

An interval between the neighboring grooves 135 may be zero, as shown in FIG. 5A or 5B, or may be larger than zero, as shown in FIG. 6.

A distance between the grooves 135 and a top surface of the lower passivation film 130 may be from about 5 µm to about 50 µm, but it is not limited thereto.

Moreover, the height of the grooves 135 of the lower passivation film 130 may be from about 10 µm to about 100 µm, but it is not limited thereto.

The lower passivation film 130 may include films such as polyethylene terephthalate (PET) and the like, and the plurality of grooves 135 may be formed by an imprinting method.

An adhesive layer (not illustrated) may be further disposed between the lower passivation film 130 and the flexible substrate 112.

The adhesive layer may include silicon, urethane, acryl, and the like, and may further include nanoparticles made of a silicon oxide $SiO_x$, aluminum, and the like. The thickness of the adhesive layer may be from about 5 µm to about 50 µm, but it is not limited thereto.

When the lower passivation film 130 is attached to a bottom surface of the flexible substrate 112 and then the first peripheral area PA_a and a part of the second peripheral area PA_b disposed thereunder are bent towards a rear side of the display area along the bending line CL, stresses applied to the display element layer 200 may be reduced and bending may be easily performed.

Accordingly, the stress, which is a deforming force, applied to the display element layer 200 may be reduced such that damage to the display element layer (e.g., the light emitting layer) 200 including the thin film transistor, the light emitting diode LD, the encapsulation layer 379, the wiring portions WR1 and WR2, and the pad area PDA may be reduced.

FIG. 5A and FIG. 5B respectively illustrate a strain distribution graph G when the display panel manufactured by a manufacturing method according to an exemplary embodiment of the present invention includes the neutral plane balancing layer 380 and the lower passivation film 130.

Based on the neutral plane NP, the upper part shows a tensile strain and the lower part shows a compressive strain.

According to an exemplary embodiment of the present invention, the neutral plane NP of the strain distribution graph G may be disposed close to the display element layer 200, as shown in FIG. 5A, or may be disposed in the display element layer 200, as shown in FIG. 5B.

Further, depending on the thickness T1 of the neutral plane balancing layer 380, the stress applied to the display element layer 200 may be a compressive stress.

Accordingly, when the first peripheral area PA_a and the part of the second peripheral area PA_b disposed thereunder are bent towards the rear side of the display area DA along the bending line CL, a tensile stress applied to the display element layer 200 including the wiring portions WR1 and WR2 and the pad area PDA may be reduced or a less damaging stress may be applied to the display element layer 200, thereby resulting in preventing the display element layer 200 from being damaged and easier bending of the first peripheral area PA_a and the part of the second peripheral area PA_b disposed thereunder. Referring to FIG. 7, after the first peripheral area PA_a and the part of the second peripheral area PA_b disposed thereunder in the display panel which includes the neutral plane balancing layer 380 and the lower passivation film 130 are bent towards the rear side of the display area DA along the bending line CL, the first peripheral area PA_a and the part of the second peripheral area PA_b disposed thereunder at respective lateral sides of the display area DA are not virtually seen when viewed from a frontal side of the display panel.

In this instance, the curvature radius of a part of the display panel folded along the bending line may be from about 0.5 mm to about 10 mm.

Further, the entire flexible display panel may be bent with an approximate curvature radius of about 50 mm to about 400 m to form a curved display panel.

Thus, when viewed from the frontal side of the display panel, only the display area DA is seen, as shown in FIG. 8, while the peripheral area PA at respective lateral sides of the display area disappears.

That is, non-display area of the flexible display panel, which does not display an image, may be easily removed.

As described above, according to an exemplary embodiment of the present invention, attaching the lower passivation film 130 having the plurality of grooves 135 to the bottom side of the flexible substrate 112 and forming the neutral plane balancing layer 380 at the upper part of the display element layer 200 of the peripheral area PA may simultaneously result in easier bending of the peripheral area PA and preventing the display element layer 200 including the wiring portions WR1 and WR2 and the pad area PDA from being damaged.

Figure 9:
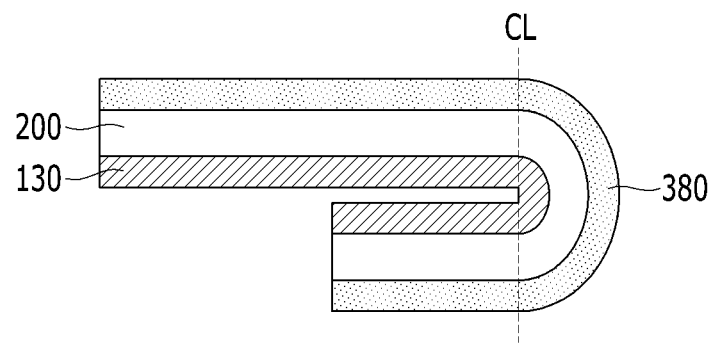
FIG. 9 is a cross-sectional view showing a state in which the peripheral area of the display panel according to an exemplary embodiment of the present invention is folded backwards.

FIG. 9 is a top plan view illustrating the non-display area of the display panel folded backward according to an exemplary embodiment of the present invention.

Referring to FIG. 9, a flexible display panel according to an exemplary embodiment of the present invention is almost the same as the flexible display panel according to the exemplary embodiment described above, but a bottom surface of the passivation film 130 attached to the lower part of the flexible substrate 112 may not have protrusions and depressions.

Although the lower part of the lower passivation film 130 does not have protrusions and depressions, since at least the neutral plane balancing layer 380 overlapped with the bending line CL is still formed at the upper part of the display element layer 200 of the second peripheral area PA_b, the neutral plane tensile stress applied to the display element layer 200 may be virtually reduced as the position of the neutral plane NP is disposed closer to the display element layer 200 when the first peripheral area PA_a and the part of the second peripheral area PA_b disposed thereunder are folded towards the rear side of the display area DA along the bending line CL.

Accordingly, the first peripheral area PA_a and the part of the second peripheral area PA_b disposed thereunder may be easily bent, and the non-display area may be easily removed from the display panel without damaging the display element layer 200 including the wiring portions WR1 and WR2 and the pad area PDA.

Now, together with the drawings described above, referring to FIG. 10 to FIG. 13, a manufacturing method of a flexible display panel and the flexible display panel manufactured thereby according to an exemplary embodiment of the present invention will be described.

The same constituent elements as the exemplary embodiments described above designate the same reference numerals, and the repeated description will be omitted.

Figure 10:
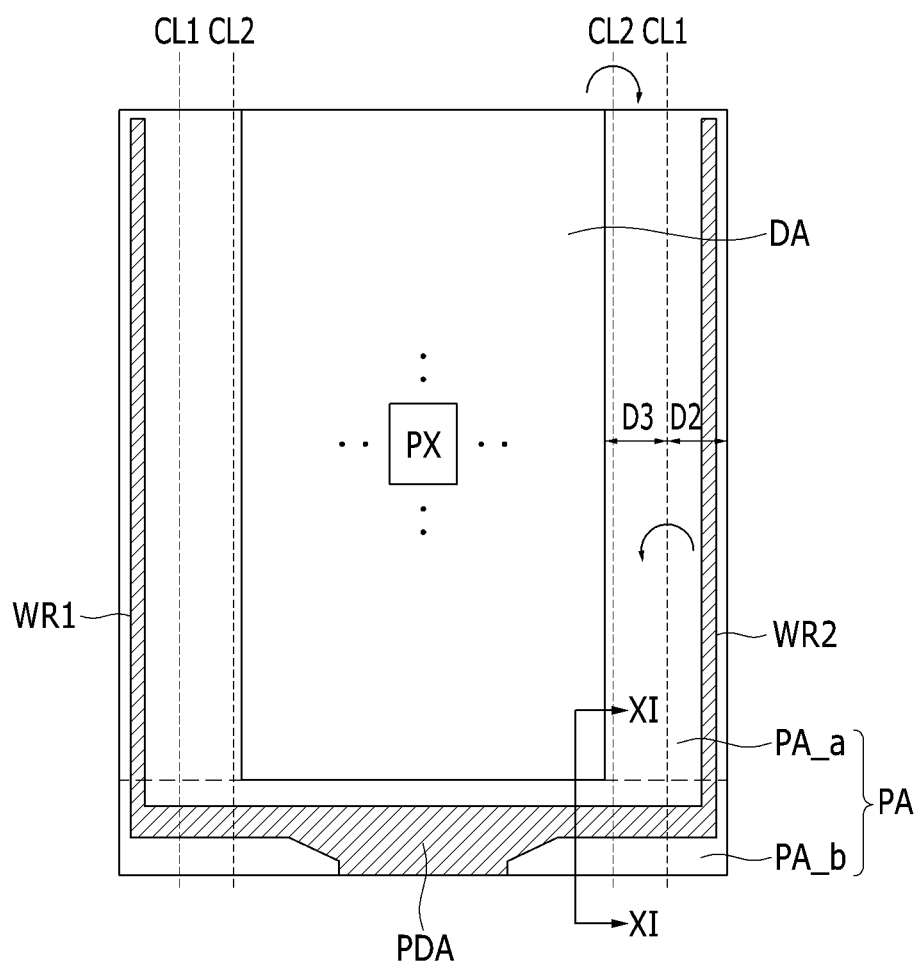
FIG. 10 is a top plan view of the display panel before the peripheral area is folded backwards in a manufacturing process of a flexible display panel according to an exemplary embodiment of the invention.
Figure 11:
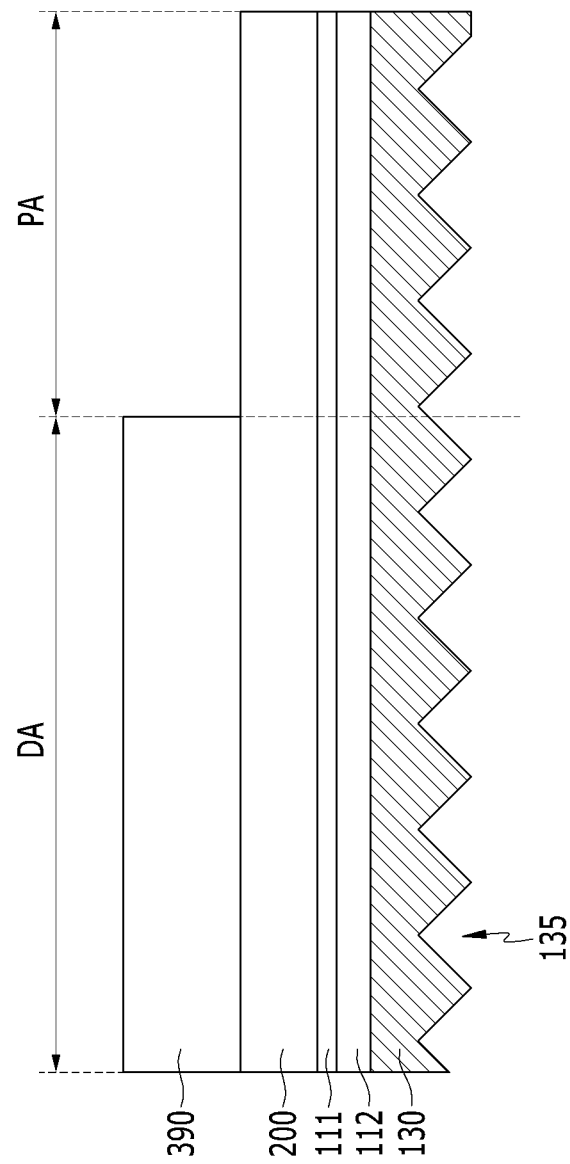
FIG. 11 is a cross-sectional view of the display panel of FIG. 10 taken along the line XI-XI.
Figure 12:
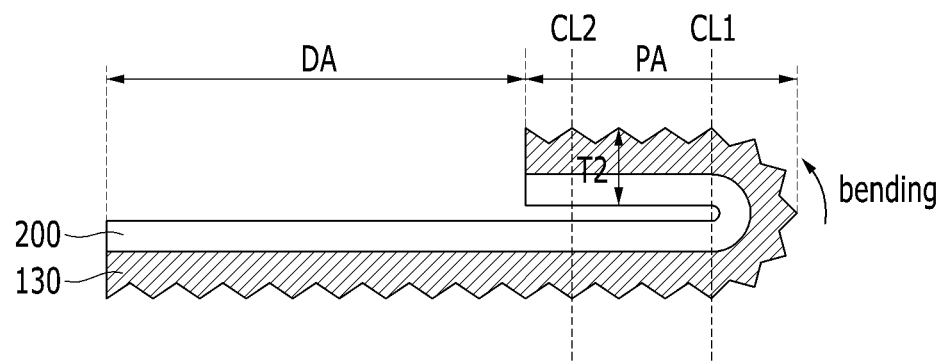
FIG. 12 is a cross-sectional view showing a state in which a part of the peripheral area of the display panel according to an exemplary embodiment of the present invention is folded forwards.
Figure 13:
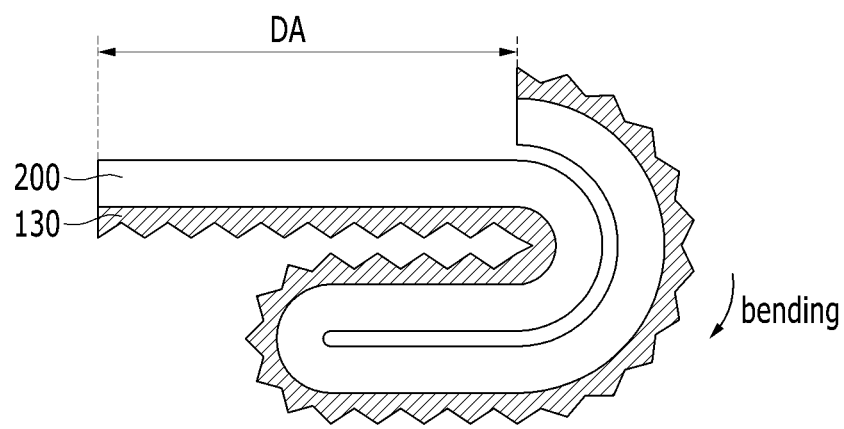
FIG. 13 is a cross-sectional view showing a state in which a part of the display panel of FIG. 12 is folded backwards.

FIG. 10 is a top plan view of the display panel before the peripheral area is folded backwards in a manufacturing process of a flexible display panel according to an exemplary embodiment of the invention, FIG. 11 is a cross-sectional view of the display panel of FIG. 10 taken along the line XI-XI, FIG. 12 is a cross-sectional view showing a state in which a part of the peripheral area of the display panel according to an exemplary embodiment of the present invention is folded forwards, and FIG. 13 is a cross-sectional view showing a state in which a part of the display panel of FIG. 12 is folded backwards.

First, referring to FIG. 10 and FIG. 11, a flexible substrate 112 is formed on a supporting substrate (not illustrated) made of glass or plastic.

The flexible substrate 112 includes a display area DA displaying an image and a peripheral area PA outside of the display area DA.

The peripheral area PA includes a first peripheral area PA_a in which the wiring portions WR1 and WR2 are disposed, and a second peripheral area in which a pad area is disposed.

Next, a barrier layer 111 may be formed on the flexible substrate 112.

The barrier layer 111 may be omitted.

Next, a display element layer 200 including a plurality of thin films is formed on the barrier layer 111.

The display element layer 200 includes a plurality of signal lines which are disposed in the display area, and a plurality of pixels PX which are connected thereto and are arranged in an approximate matrix form.

The signal line may include a plurality of scanning signal lines to transmit a scanning signal, and a plurality of data lines to transmit a data signal.

The display element layer 200 may include wiring portions WR1 and WR2 which are disposed in the peripheral area PA, and a pad area PDA which is connected to a driving portion (not illustrated) to drive pixel PX.

The pad area PDA and the wiring portions WR1 and WR2 may be connected to each other, and may be made of a conductive material.

The wiring portions WR1 and WR2 may be connected to a plurality of signal lines of the display area DA, and may be disposed at respective lateral sides of the display area DA.

The display element layer 200 may include a thin film transistor, a light emitting diode LD, and an encapsulation layer 379, and a detailed structure of the display element layer 200 may be the same as that of the exemplary embodiment described above.

The wiring portions WR1 and WR2 and the pad area PDA of the peripheral area PA are disposed on the same layer as a gate conductive layer or data conductive layer, and may be integrally formed when the gate conductive layer or data conductive layer is formed.

Next, referring to FIG. 11, to improve visibility by reducing reflection of external light, an anti-reflection layer 390 may be attached to an upper part of the display element layer 200 of the display area DA.

The anti-reflection layer 390 may be disposed only on the display area DA, or may not only be disposed on the display area but may also further extend to intrude on the first peripheral area PA_a.

The anti-reflection layer 390 may include a polarizer (not illustrated) or a plurality of thin film layers (not illustrated).

In case the anti-reflection layer 390 includes the plurality of thin film layers, the plurality of thin film layers may include at least one thin metal film layer and at least one dielectric layer which are alternately laminated.

Next, the supporting substrate is separated from the flexible substrate 112.

A lower passivation film 130 is attached to a bottom side of the flexible substrate 112 after separating the flexible substrate 112 from the supporting substrate.

The lower passivation film 139 may be disposed in both the display area DA and the peripheral area PA.

Referring to FIG. 11, the bottom side of the lower passivation film 130 may have protrusions and depressions including a plurality of grooves 135.

The plurality of grooves 135 may be regularly or irregularly disposed, and the grooves 135 may have regular or irregular shapes.

Each groove 135 may have a triangular shape, as shown in FIG. 11, or may have a quadrangular shape such as trapezoidal shape and the like, as shown in FIG. 6 described above.

An interval between the grooves 135 and the top side of the lower passivation film 130 may be from about 5 μm m to about 50 μm, but it is not limited thereto.

Moreover, the height of the grooves 135 of the passivation film 130 may be from about 10 μm to about 100 μm, but it is not limited thereto.

The lower passivation film 130 may include films such as polyethylene terephthalate (PET) and the like, and may be formed with the plurality of grooves 135 by an imprinting method.

Next, referring to FIG. 10 to FIG. 12, the first second peripheral area PA_a and an outer portion of the second peripheral area PA_b disposed thereunder in the display area including the lower passivation film 130 are folded forward along a first bending line CL1.

The first bending line CL1 divides the first peripheral area PA_a into two areas, and the horizontal lengths D2 and D3 of the divided areas may be the same as or different from each other.

Referring to FIG. 12, the first peripheral area PA_a folded forward, and the part of the second peripheral area PA_b disposed thereunder does not intrude on the display area DA.

The curvature radius of the part folded along the first bending line CL1 may be from about 0.5 mm to about 10 mm.

Referring to FIG. 12, the first peripheral area PA_a folded forward along the first bending line CL1, and the outer portion of the part of the second peripheral area PA_b thereunder may raise the neutral plane NP by the thickness T2.

That is, the outer portion of the peripheral area PA_a folded upwards along the first bending line CL1 may raise the position of the neutral plane NP such that a tensile stress applied to the display element layer 200 may be reduced or a less damaging compressive stress may be applied to the display element layer 200 when the peripheral area PA folded along the second bending line CL2 is later folded towards the rear side of the display area DA.

Accordingly, the first peripheral area PA_a folded upwards along the first bending line CL1 and the outer portion of the part of the second peripheral area PA_b disposed thereunder may perform the same function as the neutral plane balancing layer 380 according to the exemplary embodiment described above. The first bending of the display panel along the first bending line CL1 may place the neutral plane NP higher than the position from which the lower passivation film 130 and is 120 μm away, but it is not limited thereto.

Next, referring to FIG. 10 and FIG. 13, the peripheral area PA folded upwards along the first bending line CL1 is folded along the second bending line CL2 towards the rear side of the display area DA such that the peripheral area PA disposed at respective lateral sides of the display area DA is not virtually seen when viewed from the frontal side thereof.

In this case, the curvature radius of a part of the display panel folded along the second bending line CL2 may be from about 0.5 mm to about 10 mm.

Herein, the bending line CL2 may virtually overlap a border line between the display area DA and the first peripheral area PA_a, or may be disposed on the periphery of the border line.

According to an exemplary embodiment of the present invention, since a lower surface of the lower passivation film 130 includes protrusions and depressions formed with the plurality of grooves 135, stresses applied to the display element layer 200 may be reduced and bending may be easily performed when folding the display panel along the first and second bending lines CL1 and CL2.

Accordingly, a stress, which is a deformation force, applied to the display element layer 200 may be reduced, and damage to the thin film transistor, the light emitting diode LD, the encapsulation layer 379, the wiring portions WR1 and WR2, the pad area PDA may be reduced.

Thus, as shown in FIG. 8 described above, when viewed from the frontal side of the display panel, only the display area DA is seen, and the first peripheral area PA_a and the second peripheral area PA_b disposed thereunder may disappear.

That is, the non-display area incapable of displaying an image may be easily removed in the flexible display panel.

Thus, according to an exemplary embodiment of the present invention, the lower passivation film 130 formed with the plurality of grooves 135 is attached to the lower part of the flexible substrate 112, and the peripheral area PA is folded twice along the first and second bending lines CL1 and CL2, thereby resulting in easier bending of the peripheral area PA along the second bending line CL2 and simultaneously preventing the display element layer 200 including the wiring portions WR1 and WR2 and the pad area PDA from being damaged.

Figure 14:
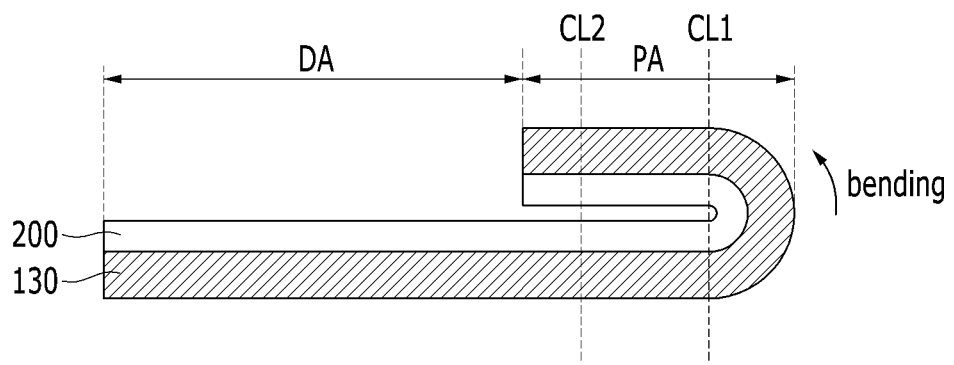
FIG. 14 is a cross-sectional view showing a state in which a part of the peripheral area of the display panel according to an exemplary embodiment of the present invention is folded forwards.
Figure 15:
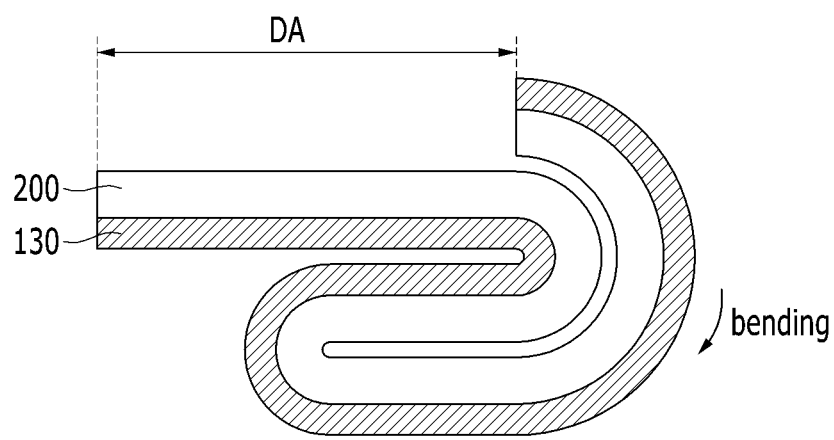
FIG. 15 is a cross-sectional view showing a state in which a part of the display panel of FIG. 14 is folded backwards.

FIG. 14 is a cross-sectional view showing a condition in which a part of the peripheral area of the display panel according to an exemplary embodiment of the present invention is folded forwards, and FIG. 15 is a cross-sectional view showing a condition in which a part of the display panel of FIG. 14 is folded backwards.

Referring to FIG. 14, a flexible display panel according to an exemplary embodiment of the present invention is almost the same as the flexible display panel according to the exemplary embodiment illustrated in FIG. 10 to FIG. 13, but a bottom side of the passivation film 130 attached to the lower part of the flexible substrate 112 may not have protrusions and depressions.

Although the lower part of the lower passivation film 130 does not have protrusions and depressions, since the peripheral area is folded upwards along the first bending line CL1 and substantially raises the neutral plane NP, a tensile stress applied to the display element layer 200 may be reduced or a compressive stress may be applied thereto when the peripheral area PA is folded towards the rear side of the display area along the second bending line CL2.

Accordingly, without damaging the display element layer 200, the peripheral area PA may be easily bent and the non-display area may be easily removed from the display panel.

When a couple of the flexible display panels according to an exemplary embodiment described above are connected together, an all-round display device capable of displaying an image at both front and rear sides may be embodied without a non-display area.

While this invention has been described in connection with various embodiments thereof, it is to be understood that the invention is not limited to the disclosed embodiments, but, on the contrary, is intended to cover various modifications and equivalent arrangements included within the spirit and scope of the appended claims.

| Description of Symbols | |
|---|---|
| 111: barrier layer | 112: flexible substrate |
| 121: scanning signal line | 124a, 124b: control electrode |
| 130: lower passivation film | 135: groove |
| 140: gate insulation layer | 154a, 154b: semiconductor |
| 171: data line | 172: driving voltage line |
| 180a, 180b: passivation layer | |
| 183a, 183b, 184, 185a, 185b, 185c: contact hole | |
| 191: pixel electrode | 270: common electrode |
| 360: pixel definition layer | 370: light emitting member |
| 371, 375: organic common layer | 373: light emitting layer |
| 379: encapsulation layer | 380: neutral plane balancing layer |
| 390: anti-reflection layer | |

What is claimed is:

1. A flexible display panel comprising:
   a flexible substrate including a first flat area, a second flat area, and a bending area between the first flat area and the second flat area;
   a wire over the first flat area, the second flat area, and the bending area;
   a polarizer over the flexible substrate;
   a lower film under the flexible substrate; and
   a first layer comprising a resin and being over the flexible substrate,
   wherein the bending area of the flexible substrate is bent along a first axis such that the first flat area and the second flat area face each other,
   wherein the first layer overlaps the bending area in a first direction perpendicular to an upper surface of the flexible substrate,
   wherein a side surface of the first layer is in contact with a side surface of the polarizer,
   wherein the lower film includes at least one depression overlapping the bending area, and
   wherein the lower film overlaps the first flat area and the second flat area.

2. The flexible display panel of claim 1, wherein the at least one depression overlaps the bending area.

3. The flexible display panel of claim 2, wherein the depression has at least three sides that extend in different directions from each other in a sectional view.

4. The flexible display panel of claim 2, wherein the depression has at least three planes that extend in different directions from each other, and at least two edges respectively located between two adjacent planes of the at least three planes.

5. The flexible display panel of claim 1, further comprising a display element layer comprising:
thin film transistors; and
light emitting elements over the thin film transistors,
wherein the display element layer is between the flexible substrate and the polarizer.

6. The flexible display panel of claim 5, wherein the at least one depression is configured to reduce stress applied to the display element layer when the flexible substrate is bent.

7. The flexible display panel of claim 5, wherein the wire is at the display element layer.

8. The flexible display panel of claim 1, further comprising:
a barrier layer over the flexible substrate, the barrier layer comprising an inorganic insulating material; and
a display element layer comprising thin film transistors, and light emitting elements over the thin film transistors,
wherein the display element layer is between the barrier layer and the polarizer.

9. The flexible display panel of claim 8, wherein the barrier layer comprises an inorganic insulating material.

10. The flexible display panel of claim 8, wherein the display element layer further comprises an encapsulation layer for encapsulating the light emitting elements.

11. The flexible display panel of claim 1, wherein a thickness of the first layer is from about 10 μm to about 150 μm.

12. The flexible display panel of claim 1, wherein a thickness of the first layer in the first direction is less than a thickness of the polarizer in the first direction.

13. The flexible display panel of claim 1, further comprising a display element layer comprising:
thin film transistors; and
light emitting elements over the thin film transistors,
wherein the polarizer and the first layer are at a same level on the display element layer.

14. The flexible display panel of claim 1, further comprising a display element layer having an upper surface,
wherein the polarizer and the first layer contact the upper surface of the display element layer.

15. The flexible display panel of claim 1, wherein a curvature radius of the first layer is greater than a curvature radius of the wire over the bending area.

* * * * *